US008471604B2

(12) United States Patent
Permuy et al.

(10) Patent No.: US 8,471,604 B2
(45) Date of Patent: Jun. 25, 2013

(54) GATE DRIVE CIRCUIT AND ASSOCIATED METHOD

(75) Inventors: Alfred Permuy, Rueil-Malmaison (FR); Nicholas D. Benavides, Allison Park, PA (US); Luke Solomon, New Kensington, PA (US)

(73) Assignee: GE energy Power Conversion Technology Limited, Warwickshire (GB)

( * ) Notice: Subject to any disclaimer, the term of this patent is extended or adjusted under 35 U.S.C. 154(b) by 0 days.

(21) Appl. No.: 13/450,599

(22) Filed: Apr. 19, 2012

(65) Prior Publication Data

US 2013/0099831 A1    Apr. 25, 2013

Related U.S. Application Data

(60) Provisional application No. 61/477,697, filed on Apr. 21, 2011, provisional application No. 61/482,348, filed on May 4, 2011.

(51) Int. Cl.
  *H03K 3/00* (2006.01)
(52) U.S. Cl.
  USPC ............ 327/108; 327/109; 327/110; 327/111
(58) Field of Classification Search
  USPC .................... 327/108–111; 326/82
  See application file for complete search history.

(56) References Cited

U.S. PATENT DOCUMENTS

| | | | | |
|---|---|---|---|---|
| 7,626,397 B2* | 12/2009 | Opfer et al. | ................ | 324/509 |
| 7,817,396 B2* | 10/2010 | Tao et al. | ................ | 361/112 |
| 8,000,069 B2* | 8/2011 | Montenegro et al. | ......... | 361/71 |
| 8,400,778 B2* | 3/2013 | Hsing et al. | ................ | 361/772 |
| 2004/0222484 A1* | 11/2004 | Saxelby et al. | ............. | 257/502 |
| 2008/0106151 A1* | 5/2008 | Ryoo et al. | ................ | 307/106 |
| 2010/0090539 A1* | 4/2010 | Auchterlonie | ............. | 307/106 |
| 2010/0118918 A1* | 5/2010 | Dupuis | ................ | 375/130 |

* cited by examiner

*Primary Examiner* — Adam Houston
(74) *Attorney, Agent, or Firm* — Eckert Seamans Cherin & Mellott, LLC; Philip E. Levy

(57) ABSTRACT

A method of driving a number of series connected active power semiconductor groups, wherein each of the active power semiconductor groups includes one or more gate oxide-isolated active power semiconductor devices. The method includes generating a current pulse, providing the current pulse to a primary portion of a transformer unit and in response thereto causing a number of reflected current pulses to be reflected at a secondary portion of the transformer unit, and transferring and latching each of the reflected current pulses to create a respective latched gate drive signal, and providing each respective latched gate drive signal to an associated one of the active power semiconductor groups for driving the one or more gate oxide-isolated active power semiconductor devices of the associated one of the active power semiconductor groups. Also, a gate drive circuit that implements the method.

23 Claims, 5 Drawing Sheets

GATE DRIVE CIRCUIT AND ASSOCIATED METHOD

CROSS-REFERENCE TO RELATED APPLICATIONS

This application claims priority under 35 U.S.C. §119(e) from provisional U.S. patent application Nos. 61/477,697 and 61/482,348, each entitled "Gate Drive Circuit" and filed on Apr. 21, 2011 and May 4, 2011, respectively, the contents of which are incorporated herein by reference.

BACKGROUND OF THE INVENTION

1. Field of the Invention

The present invention pertains to electronic devices, such as power electronic devices (e.g., multi-level power inverters), that employ series connected gate oxide-isolated active power semiconductor devices, and, in particular, to a method and circuit for driving series connected gate oxide-isolated active power semiconductor devices in such electronic devices while maintaining voltage sharing across each series connected gate oxide-isolated active power semiconductor device, voltage isolation and, in some embodiments, controller redundancy.

2. Description of the Related Art

A number of different power conversion modules/systems are well known for converting power from one form to another. For example, a multilevel power inverter is a power electronic device that is structured to produce AC waveforms from a DC input voltage. As another example, an active front end (also called a controllable rectifier or PWM rectifier) is a power electronic device wherein AC waveforms are converted to DC voltages. Such power conversion modules/systems are used in a wide variety of applications, such as, without limitation, variable speed motor drives.

Many power conversion modules/systems employ power electronics that require (i) voltage isolation between the controlling logic signals and the output power channel, and/or (ii) series connection of independently controlled/driven active power semiconductor devices to achieve voltage ratings. Such isolation and independent control are often provided by what is known as a gate drive circuit. More specifically, a gate drive circuit is a circuit that is used in a power electronic device to convert logic level control signals into the appropriate voltages for switching the active power semiconductor devices of the power electronic device, and, in most cases, to provide voltage isolation so that the logic signals are not connected to the potentially dangerous high voltage on the power circuit.

A number of gate drive circuits/techniques for providing the above described isolation and/or control functionality have been developed. For example, one such technique includes applying fiber optic transceivers or other opto-isolators with dedicated isolated power supplies to achieve the isolation. Another technique uses a transformer to transfer a voltage directly across the barrier while maintaining galvanic isolation. Still another technique employs a combination of the above, where transformers are used for the digital on-off signal, while power is transferred separately with an isolated power source. These known techniques, however, are costly and often do not provide the precise synchronization needed for control of series connected of active power semiconductor devices.

SUMMARY OF THE INVENTION

In one embodiment, a drive circuit for driving a number of series connected active power semiconductor groups is provided, wherein each of the active power semiconductor groups includes one or more gate oxide-isolated active power semiconductor devices. The drive circuit includes a control module, a current pulse generation module structured to generate a current pulse based on an output of the control module, a transformer unit coupled to the current pulse generation module, the transformer unit being structured to receive the current pulse at a primary portion of the transformer unit and in response thereto cause a number of reflected current pulses to be reflected at a secondary portion of the transformer unit, and a number of pulse receiver modules. Each pulse receiver module is coupled to the secondary portion of the transformer unit and to an associated one of the active power semiconductor groups. Each pulse receiver module receives an associated one of the reflected current pulses and transfers and latches the associated one of the reflected current pulses to create a latched gate drive signal that is provided to the associated one of the active power semiconductor groups for driving the one or more gate oxide-isolated active power semiconductor devices of the associated one of the active power semiconductor groups.

In another embodiment, a method of driving a number of series connected active power semiconductor groups is provided, wherein each of the active power semiconductor groups includes one or more gate oxide-isolated active power semiconductor devices. The method includes generating a current pulse, providing the current pulse to a primary portion of a transformer unit and in response thereto causing a number of reflected current pulses to be reflected at a secondary portion of the transformer unit, and transferring and latching each of the reflected current pulses to create a respective latched gate drive signal, and providing each respective latched gate drive signal to an associated one of the active power semiconductor groups for driving the one or more gate oxide-isolated active power semiconductor devices of the associated one of the active power semiconductor groups.

These and other objects, features, and characteristics of the present invention, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

DETAILED DESCRIPTION OF EXEMPLARY EMBODIMENTS

Figure 1:
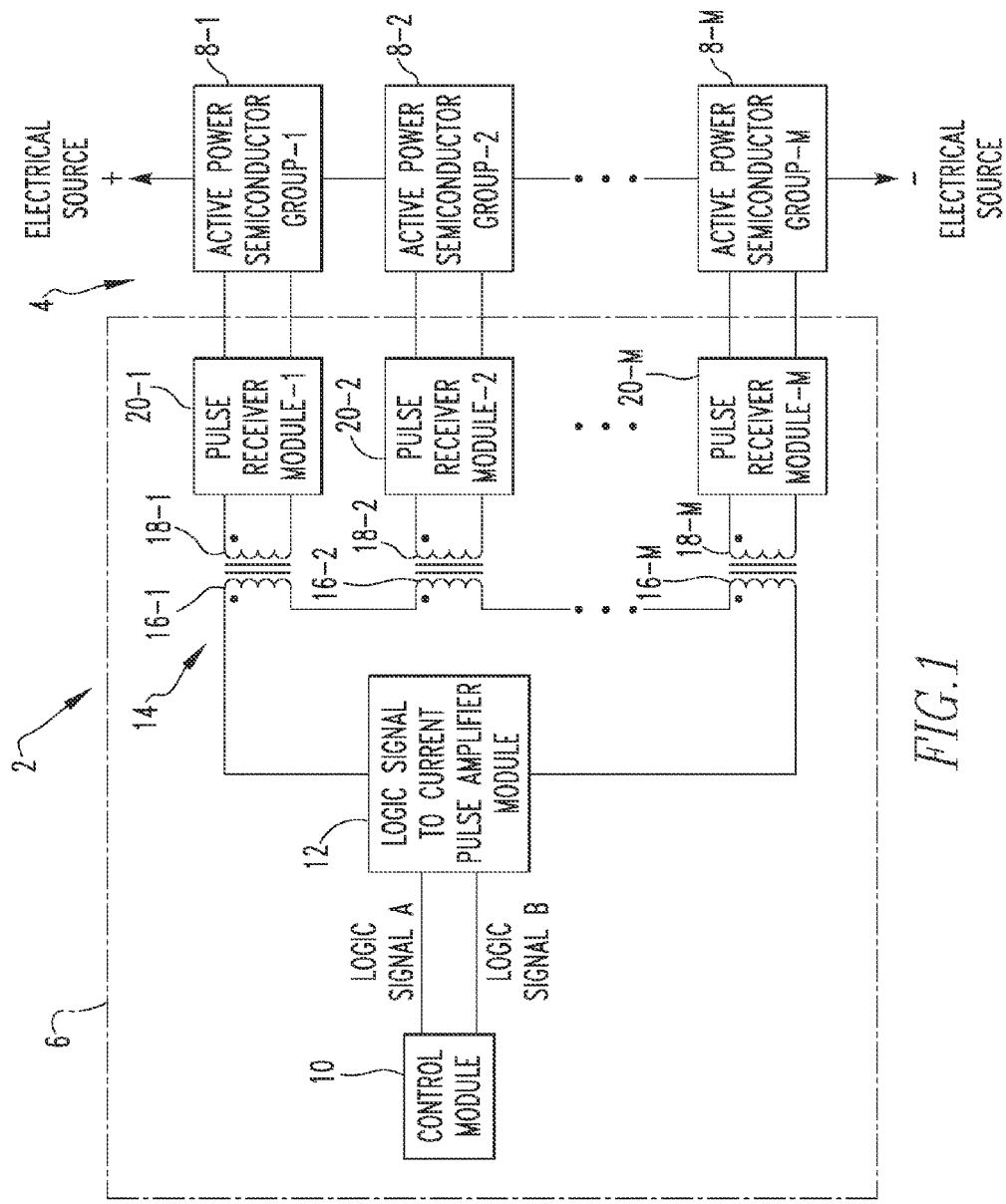
FIG. 1 is a schematic diagram of an exemplary embodiment of an electronic system implemented according to the principles of the present invention.

As used herein, the singular form of "a", "an", and "the" include plural references unless the context clearly dictates otherwise. As used herein, the statement that two or more parts or components are "coupled" shall mean that the parts are joined or operate together either directly or indirectly, i.e., through one or more intermediate parts or components, so long as a link occurs. As used herein, "directly coupled" means that two elements are directly in contact with each other. As used herein, "fixedly coupled" or "fixed" means that two components are coupled so as to move as one while maintaining a constant orientation relative to each other.

As used herein, the word "unitary" means a component is created as a single piece or unit. That is, a component that includes pieces that are created separately and then coupled together as a unit is not a "unitary" component or body. As employed herein, the statement that two or more parts or components "engage" one another shall mean that the parts exert a force against one another either directly or through one or more intermediate parts or components. As employed herein, the term "number" shall mean one or an integer greater than one (i.e., a plurality).

As employed herein, the term "active power semiconductor device" shall mean a semiconductor device used as a switch or rectifier in power electronic circuits that is able to be selectively changed between a blocking state and a conducting state as commanded by a control input signal, and shall include, for example and without limitation, a thyristor, a bipolar junction transistor (BJT), an insulated gate bipolar transistor (IGBT), or a metal oxide semiconductor field-effect transistor (MOSFET). Active power semiconductor devices can be classified into two categories with respect to drive requirements, namely non gate oxide-isolated active power semiconductor devices and gate oxide-isolated active power semiconductor devices.

As employed herein, the term "gate oxide-isolated active power semiconductor device" shall mean an active power semiconductor device in which the gate or control terminal is isolated with an oxide layer. Examples of gate oxide-isolated power semiconductor devices include IGBTs and MOSFETs.

As employed herein, the term "non gate oxide-isolated active power semiconductor device" shall mean an active power semiconductor device in which the gate or control terminal is not isolated with an oxide layer. Examples of non-gate oxide-isolated power semiconductor devices include thyristors and BJTs.

As employed herein, the term "pulse transformer" shall mean a transformer that has been designed to transfer high frequency (e.g., on the order of 1 kHz and up) voltage or current pulses from the primary winding(s) to the secondary winding(s) of the transformer.

As employed herein, the term "active power semiconductor group" shall refer to a single gate oxide-isolated active power semiconductor device or to two or more gate oxide-isolated active power semiconductor devices connected in parallel.

Directional phrases used herein, such as, for example and without limitation, top, bottom, left, right, upper, lower, front, back, and derivatives thereof, relate to the orientation of the elements shown in the drawings and are not limiting upon the claims unless expressly recited therein.

The present invention, as described in detail herein in various exemplary embodiments, provides a method and circuit for driving a number of series connected gate oxide-isolated active power semiconductor devices. The method and circuit of the present invention may be employed with any set of series connected gate oxide-isolated active power semiconductor devices, and thus may be employed with any electronic device/system that includes such a set of series connected gate oxide-isolated active power semiconductor devices. For example, and without limitation, the method and circuit of the present invention may be employed with a power electronic device that includes a number of series connected gate oxide-isolated active power semiconductor devices, such as, without limitation, a multilevel power inverter, wherein the series connected gate oxide-isolated active power semiconductor devices may be used to implement the phase legs of the multilevel power inverter. In particular, U.S. application Ser. No. 13/329,422, filed on Dec. 19, 2011, owned by the assignee of the present invention and entitled "Mechanical Arrangement of a Multilevel Power Converter Circuit," describes particular alternative mechanical arrangements for a multilevel power inverter, and it will be understood that the method and circuit for driving series connected gate oxide-isolated active power semiconductor devices described herein may be employed with such multilevel power inverter arrangements. The disclosure of U.S. application Ser. No. 13/329,422 is incorporated herein by reference in its entirety. A number of other topologies for implementing a multilevel power inverter are also well known, including the neutral point clamped (NPC) topology, the flying capacitor (FC) topology and the H-bridge topology, and it will be understood that the method and circuit for driving series connected gate oxide-isolated active power semiconductor devices described herein may be employed with any of such topologies, or any other known or hereafter developed topology that may be used to implement a multilevel power inverter. Furthermore, it will be understood that the above reference to multilevel power inverters is meant to be exemplary only, and that it is specifically contemplated the present invention may be implemented in connection with any electronic device that includes a number of series connected gate oxide-isolated active power semiconductor devices.

FIG. 1 is a schematic diagram of an exemplary embodiment of an electronic system 2 implemented according to the principles of the present invention. Electronic system 2 includes a set of series connected gate oxide-isolated active power semiconductor devices, identified by the reference numeral 4, which is driven by a gate drive circuit 6. As seen in FIG. 1, set 4 of series connected gate oxide-isolated active power semiconductor devices includes a number of active power semiconductor groups 8 connected in series. In the illustrated, non-limiting exemplary embodiment, a total of M active power semiconductor groups 8, labeled 1 through M, are provided. It will be understood, however, that this is meant to be exemplary only, and that less then M (e.g., 1 or 2) active power semiconductor groups 8 may be provided in set 4. In addition, as stated elsewhere herein, each active power semiconductor group 8 includes either a single gate oxide-isolated active power semiconductor device or to two or more gate oxide-isolated active power semiconductor devices connected in parallel. As also stated elsewhere herein, set 4 comprising the M active power semiconductor groups 8 may form part of, for example and without limitation, a phase leg of a multilevel power inverter.

As described in greater detail below, gate drive circuit 6 is coupled to set 4 comprising the M active power semiconductor groups 8, and is structured to generate a number of voltage signals for individually and in a synchronized manner driving each active power semiconductor group 8 in set 4. As seen in FIG. 1, gate drive circuit 6 includes a control module 10, a logic signal to current pulse amplifier module 12 coupled to the output of control module 10, a pulse transformer unit 14 comprising M primary winding loops 16 (labeled 1 through M) coupled to M secondary winding loops 18 (labeled 1 through M), and M pulse receiver modules 20 (labeled 1 through M). In the exemplary embodiment, each of the M primary winding loops 16 is identical to one another and each of the M secondary winding loops 18 is identical to one another (i.e., the same magnetic core, turns ratio, and leakage inductance is employed). In the exemplary embodiment, each primary winding loop 16 (1 through M) of pulse transformer unit 14 is wired in series so that all pulse transformers will have the same current. The output of logic signal to current pulse amplifier module 12 is provided to each primary winding loop 16 of pulse transformer unit 14 such that each primary winding loop 16 will receive the same signal (i.e., the same current pulse) output from logic signal to current pulse amplifier module 12. In addition, as seen in FIG. 1, each pulse receiver module 20 is coupled to an associated one of the secondary winding loops 18 of pulse transformer unit 14. Finally, the output of each pulse receiver module 20 is coupled to the gate(s) of the gate oxide-isolated active power semiconductor devices of an associated one of the active power semiconductor groups 8. Particular non-limiting exemplary embodiments of control module 10, logic signal to current pulse amplifier module 12 and pulse receiver module 20 are described in greater detail elsewhere herein.

Control module 10 of gate drive circuit 6 is one or more devices that is/are capable of generating logic level control signals based on particular programming. According to an aspect of the present invention, control module 10 is programmed to generate a number of logic level signals that describe the shape of a current pulse that is to be generated and output by logic signal to current pulse amplifier module 12. As described in greater detail below, that current pulse is in turn used to generate the voltage signals that drive the gate oxide-isolated active power semiconductor devices of each active power semiconductor group 8 in set 4.

In the exemplary embodiment, logic signal to current pulse amplifier module 12 is structured to generate and output four different types of current pulses based on the logic level signals output by control module 10. Those four different types of current pulses are: (i) a Turn Off Pulse, which is used to take each gate oxide-isolated active power semiconductor device of each active power semiconductor group 8 from an On (conducting) state to an Off (non-conducting) state; (ii) a Turn On Pulse, which is used to take each gate oxide-isolated active power semiconductor device of each active power semiconductor group 8 from an Off state to an On state; (iii) a Refresh Off Pulse, which is used to keep each gate oxide-isolated active power semiconductor device of each active power semiconductor group 8 in an Off state (this pulse is used when the gate oxide-isolated active power semiconductor devices are already in an Off state); and (iv) a Refresh On Pulse, which is used to keep each gate oxide-isolated active power semiconductor device of each active power semiconductor group 8 in an On state (this pulse is used when the gate oxide-isolated active power semiconductor devices are already in an On state). As will be understood by those of ordinary skill in the art, the Refresh Off Pulse and Refresh On Pulse are needed for gate oxide-isolated active power semiconductor devices that are non-latching-type switching elements, as such elements do not maintain on/off states indefinitely and must therefore be periodically refreshed if the state is to be maintained. In the exemplary embodiment, the Turn Off Pulse is a current pulse in a first (e.g., negative) direction/polarity having a first magnitude, the Refresh Off Pulse is a current pulse in the first (e.g., negative) direction/polarity having a second, smaller magnitude, the Turn On Pulse is a current pulse in a second (e.g., positive) direction/polarity having a first magnitude, and the Refresh On Pulse is a current pulse in the second (e.g., positive) direction/polarity having a second, smaller magnitude.

As noted elsewhere herein, logic signal to current pulse amplifier module 12 will output a specific one of the four different current pulses based on the logic level signals that are output by control module 10. In the non-limiting illustrated exemplary embodiment, control module 10 is structured to output two different logic level signals, referred to herein as a Logic Signal A and a Logic Signal B, and based on those two logic level signals, logic signal to current pulse amplifier module 12 will output a specific type of current pulse. In this illustrated exemplary embodiment, Logic Signal A transitions through three logical states (High, Low, Neutral) and Logical Signal B only transitions through two logical states (High, Low). Logic Signal B is, in this exemplary embodiment, operated using only the two states so that there is a zero volt state across the series connected transformer primary winding loops 16 when Logic Signal A is in the neutral state. Such a configuration will ensure that pulse transformer 14 does not pull charge back out of the gates of the gate oxide-isolated active power semiconductor devices after the current pulse has been released as described herein.

Figure 2:
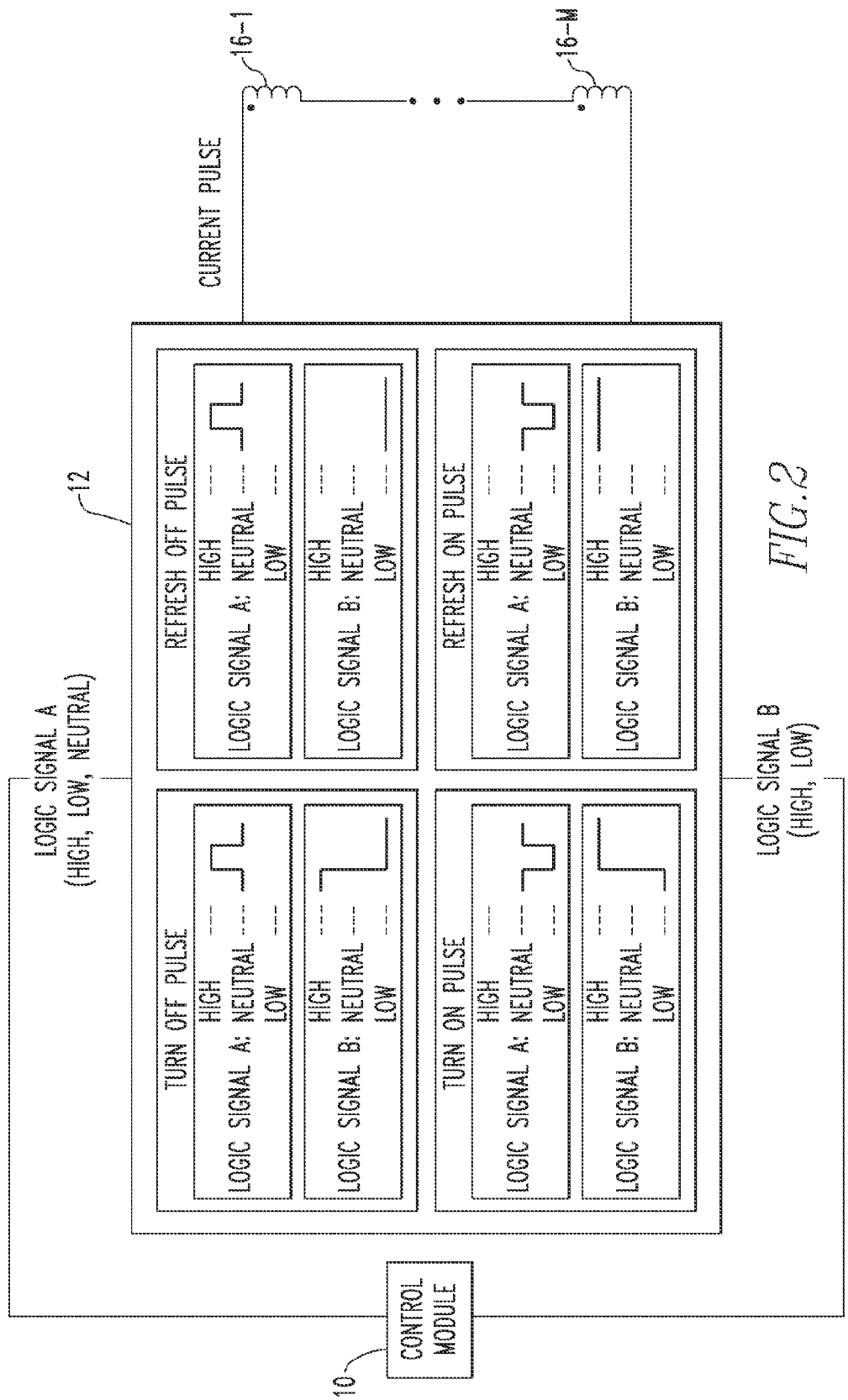
FIG. 2 is a schematic diagram illustrates how logical level signals may be used to determine four types of current pulses in the gate drive circuit of the electronic system of FIG. 1 according to one exemplary, non-limiting particular embodiment.

FIG. 2 illustrates how, in the present exemplary embodiment, the combination of such a Logic Signal A and Logic Signal B may be used to determine each of the four types of current pulses. In particular, as seen in FIG. 2, (i) if Logic Signal A transitions from Neutral to High to Neutral and Logic Signal B transitions from High to Low, logic signal to current pulse amplifier module 12 will be caused to output the Turn Off Pulse, (ii) if Logic Signal A transitions from Neutral to High to Neutral and Logic Signal B remains Low, logic signal to current pulse amplifier module 12 will be caused to output the Refresh Off Pulse, (iii) if Logic Signal A transitions from Neutral to Low to Neutral and Logic Signal B transitions from Low to High, logic signal to current pulse amplifier module 12 will be caused to output the Turn On Pulse, and (iv) if Logic Signal A transitions from Neutral to Low to Neutral and Logic Signal B remains High, logic signal to current pulse amplifier module 12 will be caused to output the Refresh On Pulse.

It will be appreciated that the particular logic scheme just described in connection with FIG. 2 is meant to be exemplary only, and that other, alternative suitable logic schemes for causing the appropriate specific types of current pulses to be generated by logic signal to current pulse amplifier module 12 may also be employed within the scope of the open invention.

Figure 3:
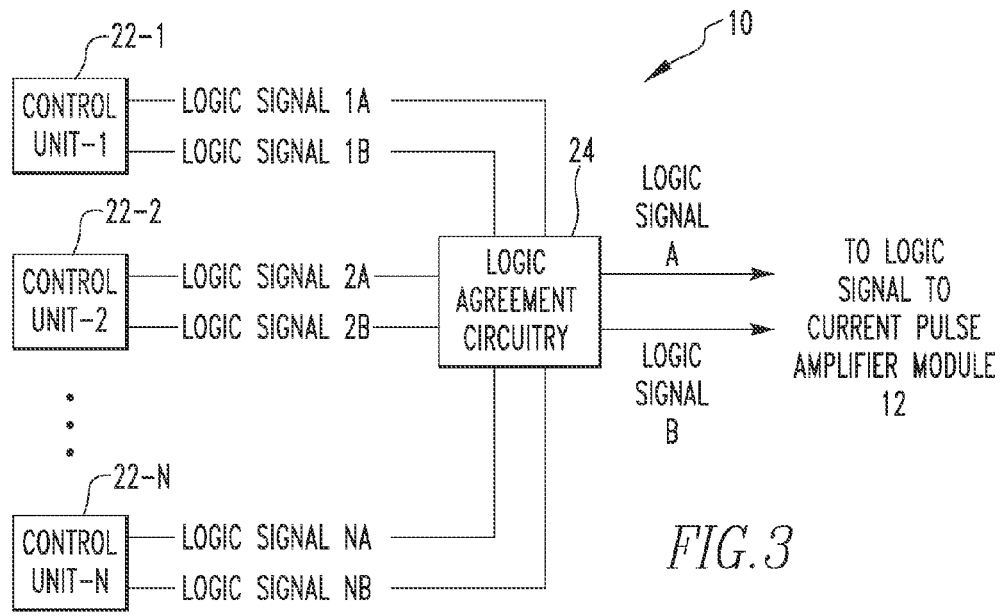
FIGS. 3 and 4 are schematic diagrams of alternative exemplary embodiments of a control module forming a part of the gate drive circuit of the electronic system of FIG. 1.

In addition, in one particular embodiment, control module 10 is a single device, such as single microprocessor, microcontroller, digital signal processor (DSP), field programmable gate array (FPGA), or some other suitable processing device, capable of outputting appropriate logic level signals (e.g., Logic Signal A and Logic Signal B as described above). As will be appreciated, such an implementation does not provide for any controller redundancy, which may be desirable in some applications. Thus, according to an alternative exemplary embodiment, shown in FIG. 3, control module 10 is implemented in a manner that provides controller redundancy. In particular, as seen in FIG. 3, control module 10 in this embodiment is comprised of an arbitrary number (from 1 to N) of control units 22 (labeled 1 through N) to provide 1+(N−1) controller redundancy. Each control unit 22 is a device, such as microprocessor, microcontroller, digital signal processor (DSP), field programmable gate array (FPGA), or some other suitable processing device, that is capable of outputting the logic level signals described elsewhere herein (e.g., Logic Signal A and Logic Signal B). Thus, in the illustrated embodiment, each control unit 22 produces the particular Logic Signal A and Logic Signal B (labeled 1A to NA and 1B to NB in FIG. 3) that describes the shape of the current pulse that is to be output by logic signal to current pulse amplifier module 12. The logic signals output by each control unit 22 are, as shown in FIG. 3, provided to logic agreement circuitry 24. In logic agreement circuitry 24, each of the received Logic Signal As is compared to one another to determine whether they all agree. If they all agree, logic agreement circuitry 24 outputs a Logic Signal A that matches the received Logic Signal As, and if they do not all agree, logic agreement circuitry 24 outputs a Neutral signal as Logic Signal A. Similarly, in logic agreement circuitry 24, each of the received Logic Signal Bs is compared to one another to determine whether they all agree. If they all agree, logic agreement circuitry 24 outputs a Logic Signal B that matches the received Logic Signal Bs, and if they do not all agree, logic agreement circuitry 24 outputs a Neutral signal as Logic Signal B. If both Logic Signal A and Logic Signal B are output in a neutral state, no current pulse will be released which will keep each gate oxide-isolated active power semiconductor device in the active power semiconductor groups 8 in its previous state.

Figure 4:
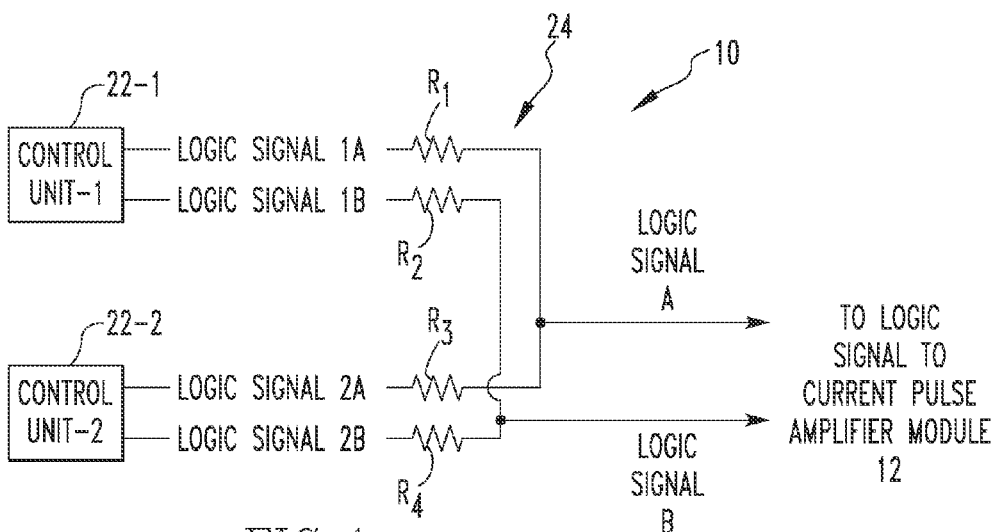

In one exemplary embodiment, logic agreement circuitry 24 is any suitable combination of logic chips and/or circuits (e.g., a number of AND and OR gates) for producing the desired logic output (e.g., Logic Signal A and Logic Signal B) based on the logic input signals from the control units 22. In another particular exemplary embodiment wherein N=2 (i.e., where two control units 22 are employed), logic agreement circuitry 24 is implemented as shown in FIG. 4. Such an implementation will only result in Logic Signal A and Logic Signal B being at a level that is sufficient to drive logic level if the outputs of the control units 22 agree.

Referring again to FIG. 1, the current pulse that is generated by logic signal to current pulse amplifier module 12 in the manner just described (i.e., as determined by the logic level signals output by control module 10) is provided to each of the primary windings 16 of pulse transformer 14 (the primary windings 16 are connected in series for this purpose). In response, a current pulse will be reflected on each secondary winding 18 of pulse transformer 14. In other words, provision of the current pulse generated by logic signal to current pulse amplifier module 12 to the primary windings 16 of pulse transformer 14 will result in M substantially identical reflected current pulses scaled by the secondary to primary turns ratio at the secondary windings 18 of pulse transformer 14. One advantage of using pulse transformer 14 in this manner is that it provides the M reflected current pulses at the secondary windings 18 in a synchronized manner while simultaneously providing voltage isolation between control module 10 and logic signal to current pulse amplifier module 12 and the higher (potentially dangerous) voltage of active power semiconductor groups 8.

Furthermore, as seen in FIG. 1 and as noted elsewhere herein, each of the M reflected current pulses is provided to an associated one of the pulse receiver modules 20. In addition, as also seen in FIG. 1, the output of each pulse receiver module 20 is provided to an associated one of the active power semiconductor groups 8.

Each pulse receiver module 20 transfers and latches the received current pulse that is appropriate for driving the gate oxide-isolated active power semiconductor device(s) of the associated active power semiconductor group 8. More specifically, in the exemplary embodiment, each pulse receiver module 20 performs two main functions on the received current pulses to establish the proper gate to emitter voltage of an IGBT or gate to source voltage of a MOSFET to drive the devices either "on" (conducting) or "off" (not conducting). First, the pulse receiver module 20 sets up and clamps to a proper level a positive or "on" state gate voltage for a positive current pulse. Likewise, the pulse receiver module 20 sets up and clamps to a proper level a negative or "off" state gate voltage for a negative current pulse. Second, the pulse receiver module 20 latches the "on" or "off" state gate voltage long after the current pulse has ended so that the gate oxide-isolated active power semiconductor device(s) within an active power semiconductor group 8 can remain in either the "on" or "off" state, respectively. This latching functionality prevents the flux reset action of pulse transformer 14 from inadvertently disturbing the proper "on" or "off" gate voltage. Each gate oxide-isolated active power semiconductor device within an active power semiconductor group 8 receives the same latched gate drive signal for all the parallel devices within that group (if more than one is present), but is unaffected by other active power semiconductor groups 8. In one particular, exemplary embodiment, this effective management of driver current flow is implemented using the circuit shown in FIG. 6, which is described in detail elsewhere herein.

Thus, in short, gate drive circuit 6 as just described in the exemplary embodiment is able to drive series connected gate oxide-isolated active power semiconductor device(s) by generating a single current pulse based on a number of predetermined logic signals (that may be generated using controller redundancy), converting that current pulse into a number of identical, synchronized reflected current pulses scaled by the secondary to primary turns ratio using a pulse transformer that provides voltage isolation functionality, and transferring the reflected current pulses that are appropriate for driving each of the gate oxide-isolated active power semiconductor device(s).

Figure 5:
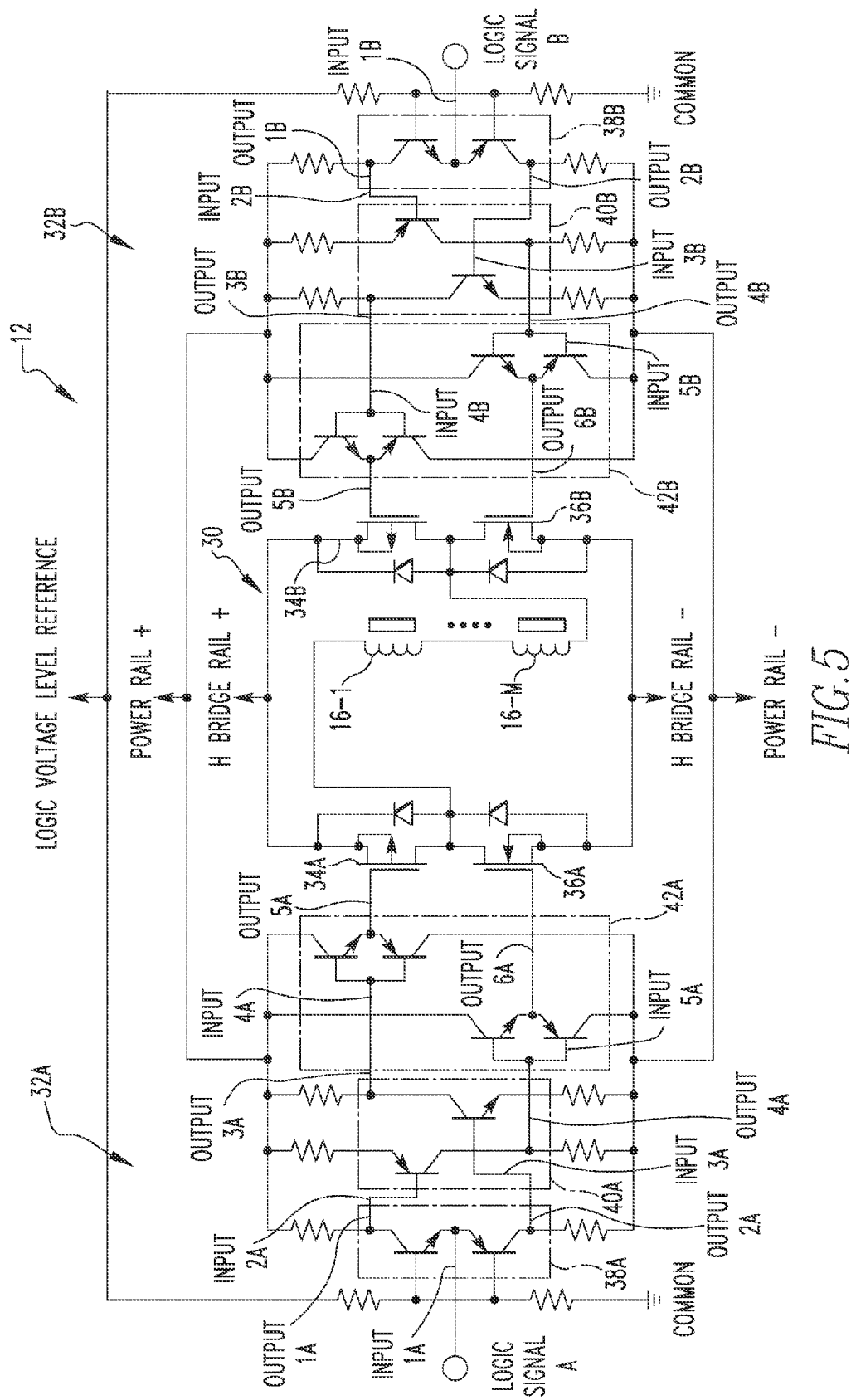
FIG. 5 is a schematic circuit diagram of a logic signal to current pulse amplifier module forming a part of the gate drive circuit of the electronic system of FIG. 1 according to one exemplary, non-limiting particular embodiment.

FIG. 5 is a schematic circuit diagram of logic signal to current pulse amplifier module 12 according to one exemplary, non-limiting particular embodiment. As seen in FIG. 5, the logic signal to current pulse amplifier module 12 in this particular embodiment includes an H-bridge 30 and two similar amplifier sides, labeled 32A and 32B for convenience, wherein amplifier side 32B is a mirror image of amplifier side 32A. H-bridge 30 includes P-channel MOSFET 34A, P-channel MOSFET 34B, N-channel MOSFET 36A, and N-channel MOSFET 36B. In addition, as described in greater detail below, amplifier side 32A is used to set the state to be released (high or low), and amplifier side 32B is used to apply a current pulse voltage to the primary winding loops of 16 pulse transformer 14.

As previously stated, Logic Signal A can take on one of three logical stages and Logic Signal B can take on one of two logical stages. Each logical state corresponds to a different Logic Voltage Level value at the nodes labeled Logic Signal A and Logic Signal B in FIG. 5. In the exemplary embodiment, Logical High corresponds to a voltage level of Logic Voltage Level Reference, Logical Neutral corresponds to a voltage level of (Logic Voltage Level Reference)/2, and Logical Low corresponds to a voltage level of Common.

The transformation of Logic Signals A and B into the coordinated conduction of the appropriate N-channel MOSFETs 36A, 36B and P-channel MOSFETs 34A, 34B in H-bridge 30 is achieved through the cascading of three Bipolar Junction Transistor (BJT) amplifier stages (described below) in each amplifier side 32A, 32B.

The first amplifier stage is a common-base amplifier stage 38A, 38B (the base of the BJT transistor is common to both the input and output of the amplifier). In this configuration, the common-base amplifier stage 38A, 38B performs the function of level shifting Logic Voltage Level signals to Power Rail+ and Power Rail− voltage levels so that the H-bridge MOSFETs 34A, 34B, 36A, 36B can be properly driven into conducting and non-conducting states. As seen in FIG. 5, each common-base amplifier stage 38A, 38B has one input labeled Input 1A, 1B. Logic signal A is wired directly to the input of common-base amplifier stage 38A stage and Logic signal B is wired directly to the input of common-base amplifier stage 38B. Thus, the input of common-base amplifier stage 38A is Logical High, Logical Neutral, or Logical Low, and the input of common-base amplifier stage 38B is Logical High or Logical Low. In addition, each common-base amplifier stage 38A, 38B has two outputs labeled Output 1A and Output 2A and Output 1B and Output 2B. Outputs 1A and 1B are used to derive the gate signals for N-channel MOSFETs 36A and 36B, and Outputs 2A and 2B are used to derive the gate signals for P-channel MOSFETs 34A and 34B. For the various logic level signals, the common-base amplifier stage 38A, 38B level shifts the input Logical Voltage Levels to Power Rail+ for Outputs 1A, 1B and Power Rail− for Outputs 2A, 2B.

The second amplifier stage is a common-emitter amplifier stage 40A, 40B (the emitter is common to both the input and output of the amplifier). As seen in FIG. 5, Output 1A, 1B of the common-base amplifier stage 38A, 38B is directly wired to Inputs 2A, 2B of the common-emitter amplifier stages 40A, 40B. Output 2A, 2B of the common-base amplifier stage 38A, 38B is directly wired to Inputs 3A, 3B of the common-emitter amplifier stages 40A, 40B. The common-emitter amplifier stages 40A, 40B take Inputs 2A, 2B, which were previously referred to Power Rail+, and refers them to Power Rail− because the N-channel MOSFET 36A, 36B is gated with respect to Power Rail−. Similarly, common-emitter amplifier stages 40A, 40B take Inputs 3A, 3B, which were previously referred to Power Rail−, and refers them to Power Rail+ because the P-channel MOSFET 34A, 34BA is gated with respect to Power Rail+.

The third amplifier stage is an emitter-follower amplifier stage 42A, 42B (also called a common-collector amplifier stage) (the collector is common to both the input and the output of the amplifier). Output 3A, 3B of the common-emitter amplifier stage 40A, 40B is directly wired to Input 4A, 4B of emitter-follower amplifier stage 42A, 42B. Output 4A, 4B of the common-emitter amplifier stage 40A, 40B is directly wired to Input 5A, 5B of emitter-follower amplifier stage 42A, 42B. Each emitter-follower amplifier stage 42A, 42B serves as a voltage buffer or impedance reducer. The voltage at Input 4A, 4B of emitter-follower amplifier stage 42A, 42B nearly matches the voltage at Output 5A, 5B, but the output impedance of the voltage at Output 5A, 5B is much less than the output impedance of the voltage at Input 4A, 4B so that the P-channel MOSFETs 34A, 34B are driven faster (with much less impedance). Similarly, the voltage at Input 5A, 5B of emitter-follower amplifier stage 42A, 42B nearly matches the voltage at Output 6A, 6B, but the output impedance of the voltage at Output 6A, 6B is much less than the output impedance of the voltage at Input 5A, 5B so that the N-channel MOSFETs 36A, 36B are driven faster (with much less impedance).

Logic Signal A being at Logical High corresponds to P-channel MOSFET 34A conducting and N-channel MOSFET 36A not conducting. Logic Signal A being at Logical Neutral corresponds to P-channel MOSFET 34A not conducting and N-channel MOSFET 36A not conducting. Logic Signal A being at Logical low corresponds to P-channel MOSFET 34A not conducting and N-channel MOSFET 36A conducting. Note that the state of Logic Signal A does not affect the operation of P-channel MOSFET 34B or N-channel MOSFET 36B.

Similarly, Logic Signal B being at Logical High corresponds to P-channel MOSFET 34B conducting and N-channel MOSFET 36B not conducting. Logic Signal B being at Logical Neutral corresponds to P-channel MOSFET 34B not conducting and N-channel MOSFET 36B not conducting. Logic Signal B being at Logical Low corresponds to P-channel MOSFET 34B not conducting and N-channel MOSFET 36B conducting. Note that the state of Logic Signal B does not affect the operation of P-channel MOSFET 34A or N-channel MOSFET 36A.

The MOSFETs 34A, 34B, 36A, 36B of H-bridge 30 are operated in such a way to put a positive voltage across the series connected, low magnetizing inductance primary winding loops 16 of pulse transformer 14 to produce a positive (or Turn On or Refresh On) current pulse. A positive current pulse is achieved by turning on P-Channel MOSFET 34A and N-Channel MOSFET 36B. The MOSFETs 34A, 34B, 36A, 36B of H-bridge 30 are operated in such a way to put a negative voltage across the series connected, low magnetizing inductance primary winding loops 16 of pulse transformer 14 to produce a negative (or Turn Off or Refresh Off) current pulse. A negative current pulse is achieved by turning on N-Channel MOSFET 36A and P-Channel MOSFET 34B.

After the release of a Turn On or Refresh On current pulse, the MOSFETs 34A, 34B, 36A, 36B of H-bridge 30 are operated in a such a way to put a zero voltage across the series connected, low magnetizing inductance primary winding loops 16 of pulse transformer 14 to produce no current pulses. A no current pulse is achieved by turning off N-Channel MOSFET 36A and leaving on N-channel MOSFET 36B. Similarly, after the release of a Turn Off or Refresh Off current pulse, the MOSFETs 34A, 34B, 36A, 36B of H-bridge 30 are operated in a such a way to put a zero voltage across the series connected, low magnetizing inductance primary winding loops 16 of pulse transformer 14 to produce no current pulses. A no current pulse is achieved by turning off N-Channel MOSFET 36A and leaving on P-channel MOSFET 34B.

Figure 6:
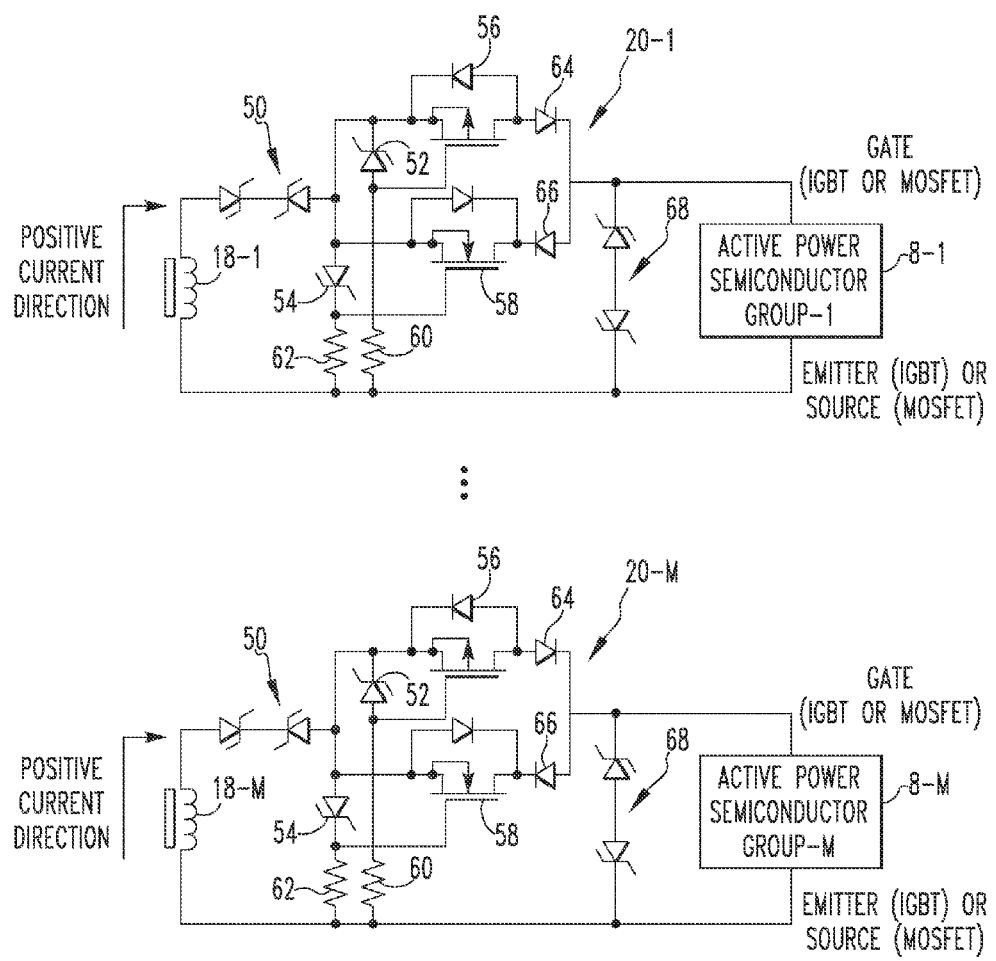
FIG. 6 is a schematic circuit diagram showing a number of pulse receiver modules forming a part of the gate drive circuit of the electronic system of FIG. 1 as implemented according to one exemplary, non-limiting particular embodiment.

FIG. 6 is a schematic circuit diagram showing pulse receiver modules 20 as implemented according to one exemplary, non-limiting particular embodiment. As shown in FIG. 6, in this implementation, the output terminals of each pulse receiver module 20 are connected to the gate and another terminal of each gate oxide-isolated active power semiconductor device (i.e., the gate and emitter in the case where, for example, the gate oxide-isolated active power semiconductor device(s) are IGBTs or the gate and source in the case where, for example, the gate oxide-isolated active power semiconductor device(s) are MOSFETs).

As seen in FIG. 6, each pulse receiver module 20 (20-1 and 20-M being shown in FIG. 6) includes the following components: a protection zener diode combination 50, a turn on pulse zener diode 52, a turn off pulse zener diode 54, a turn on pulse MOSFET 56, a turn off pulse MOSFET 58, a turn on pulse current limiting resistor 60, a turn off pulse current limiting resistor 62, a turn on pulse diode 64, a turn off pulse diode 66, and a protection zener diode combination 68. The operation of pulse receiver module 20 according to this particular exemplary embodiment is described below.

A noted elsewhere herein, a positive current pulse is reflected onto the secondary winding loops 18 of pulse transformer 14 to turn the gate oxide-isolated active power semiconductor devices of each active power semiconductor group 80N, and a negative current pulse is reflected onto the secondary winding loops 18 of pulse transformer 14 to turn the gate oxide-isolated active power semiconductor devices of each active power semiconductor group 8 OFF. Protection zener diode combination 50 performs a voltage protection (prevents or clamps the voltage to within the safe operating area for all devices mentioned) function while either a Turn On current pulse or a Turn Off current pulse is being received for turn on pulse MOSFET 56, turn off pulse MOSFET 58, turn on pulse diode 64, turn off pulse diode 66, and secondary winding loops 18 of pulse transformer 14.

Turn on pulse zener diode 52 takes a Turn On current pulse and produces a negative gate to source voltage of appropriate level at turn on pulse MOSFET 56 to turn on turn on pulse MOSFET 56. Turn off pulse zener diode 54 produces a near zero gate to source voltage at turn off pulse MOSFET 58 to keep turn off pulse MOSFET 58 off which prevents the Turn On current pulse from circulating away from the associated active power semiconductor group 8. Turn on pulse MOSFET 56 conducts and passes the Turn On current pulse to the turn on pulse diode 64. Turn on pulse diode then conducts the Turn On current pulse to protection zener diode combination 68 and the gate(s) of the devices of the associated active power semiconductor group 8, and in response a Gate to (Emitter or Source) Turn On voltage begins to form. The Gate to (Emitter or Source) Turn On voltage rises while the Turn On current pulse is still non-zero until protection zener diode combination 68 clamps the Gate to (Emitter or Source) Turn On voltage to the appropriate level. The gate oxide-isolated active power semiconductor device(s) of the associated active power semiconductor group 8 are now On. The Turn On current pulse will eventually decay to zero. When the Turn On current pulse decays to zero, a zero gate to source voltage will exist at both turn on pulse MOSFET 56 and turn off pulse MOSFET 58. A zero gate to source voltage at these MOSFETs will keep the devices turned off or not conducting. These turned off MOSFETs coupled with the turn on pulse diode 64 and turn off pulse diode 66 prevent the Turn On current pulse energy from leaving the gate of the gate oxide-isolated active power semiconductor device(s) of the associated active power semiconductor group 8, thus keeping those devices turned On.

Turn off pulse zener diode 54 takes a Turn Off current pulse and produces a positive gate to source voltage of appropriate level at turn off pulse MOSFET 58 to turn on turn off pulse MOSFET 58. Turn on pulse zener diode 52 produces zero gate to source voltage at turn on pulse MOSFET 56 to keep turn on pulse MOSFET 56 off, which prevents the Turn Off current pulse from circulating away from the associated active power semiconductor group 8. Turn off pulse MOSFET 58 conducts and passes the Turn Off current pulse to turn off pulse diode 66. Turn off pulse diode 66 then conducts the Turn Off current pulse to protection zener diode combination 68 and the gate(s) of the devices of the associated active power semiconductor group 8, and in response a Gate to (Emitter or Source) Turn Off voltage begins to form. The Gate to (Emitter or Source) Turn Off voltage falls while the Turn Off current pulse is still non-zero until protection zener diode combination 68 clamps the Gate to (Emitter or Source) Turn Off voltage to the appropriate level. The gate oxide-isolated active power semiconductor device(s) of the associated active power semiconductor group 8 are now Off. The Turn Off current pulse will eventually decay to zero. When the Turn Off current pulse decays to zero, a zero gate to source voltage will exist at both turn on pulse MOSFET 56 and turn off pulse MOSFET 58. A zero gate to source voltage at these MOSFETs will keep the devices turned off or not conducting. These turned off MOSFETs coupled with turn on pulse diode 64 and turn off pulse diode 66 prevent the Turn Off current pulse energy from leaving the gate(s) of the gate oxide-isolated active power semiconductor device(s) of the associated active power semiconductor group 8, thus keeping those devices turned Off.

The current transfer (rather than voltage transfer) behavior of the present invention differs from traditional pulse transformer gate circuits, in that the differences in gate-emitter (or gate-source) threshold voltage between the series connected gate oxide-isolated active power semiconductor device(s) of the active power semiconductor groups 8 are decoupled from each other. Thus, the interaction between the series connected gate oxide-isolated active power semiconductor devices is minimized, helping to provide a balanced switching event among all of the devices. This balance is important to sharing voltage so that the ratings of each gate oxide-isolated active power semiconductor device are fully utilized. In the exemplary embodiment, this behavior is achieved by applying a voltage to the primary winding loops 16 that is greater than the total sum of 1 through M of the maximum voltages at the active power semiconductor group 8 gate-to-emitter (or gate-source), as set by the clamping protection zener diode combination 68 nearest the group, plus the voltage drop incurred by the rest of the pulse receiver module 20, as reflected through the turns ratio of the pulse transformer 14. In one exemplary embodiment, for power IGBTs or MOSFETs, protection zener diode combination 68 keeps the voltage right at the secondary winding loops 18 of the pulse transformers clamped to around +20V or −20V. In this embodiment, a transformer primary to secondary turns ratio of 1 to 6 is employed, which means that each primary winding loop 16 will see a reflected voltage of 20/6 or 3.33V. The 3.33V will add up for each number of secondarys (for the case where there are four device groups in series, you will see 3.33*4 reflected voltage at the primary winding loops 16 or 13.32V). The voltage at the H-bridge 30 primary is 40V in this embodiment, which is higher than 13.33V in order to reap the benefits described above. The larger primary voltage ensures that the current is limited chiefly by the primary-side leakage and magnetizing inductance and not the secondary voltage being reflected back to the primary, and thus the secondary is current sourced. Typically, the pulse transformers 14 of the present invention would have a 1:k turns ratio (primary:secondary), where k greater than or equal to 1. In one particular, non-limiting embodiment, k ranges from 2 through 10.

In the claims, any reference signs placed between parentheses shall not be construed as limiting the claim. The word "comprising" or "including" does not exclude the presence of elements or steps other than those listed in a claim. In a device claim enumerating several means, several of these means may be embodied by one and the same item of hardware. The word "a" or "an" preceding an element does not exclude the presence of a plurality of such elements. In any device claim enumerating several means, several of these means may be embodied by one and the same item of hardware. The mere fact that certain elements are recited in mutually different dependent claims does not indicate that these elements cannot be used in combination.

Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

What is claimed is:

1. A drive circuit for driving a number of series connected active power semiconductor groups, each of the active power semiconductor groups comprising one or more gate oxide-isolated active power semiconductor devices, the drive circuit comprising:
    a control module;
    a current pulse generation module structured to generate a current pulse based on an output of the control module;
    a transformer unit coupled to the current pulse generation module, the transformer unit being structured to receive the current pulse at a primary portion of the transformer unit and in response thereto cause a number of reflected current pulses to be reflected at a secondary portion of the transformer unit; and
    a number of pulse receiver modules, wherein each pulse receiver module is coupled the secondary portion of the transformer unit and to an associated one of the active power semiconductor groups, and wherein each pulse receiver module receives an associated one of the reflected current pulses and transfers and latches the associated one of the reflected current pulses to create a latched gate drive signal that is provided to the associated one of the active power semiconductor groups for driving the one or more gate oxide-isolated active power semiconductor devices of the associated one of the active power semiconductor groups.

2. The drive circuit according to claim 1, wherein the primary portion of the transformer unit comprises a number of primary windings, wherein the secondary portion of the transformer unit comprises and a number of secondary windings, each of the primary windings being coupled to an associated one of the secondary windings, wherein each of the primary windings is structured to receive the current pulse and in response thereto the transformer unit is structured to cause one of the reflected current pulses to be reflected at each of the secondary windings, wherein each pulse receiver module is coupled to an associated one of the secondary windings and to the associated one of the active power semiconductor groups, and wherein each pulse receiver module receives the associated one of the reflected current pulses from the associated one of the secondary windings.

3. The drive circuit according to claim 2, wherein the number of series connected active power semiconductor groups is a plurality of series connected active power semiconductor groups, wherein the number of pulse receiver modules is a plurality of pulse receiver modules, wherein the number of primary windings is a plurality of primary windings, wherein the number of second windings is a plurality of secondary windings, and wherein the number of reflected current pulses is a plurality of reflected current pulses.

4. The drive circuit according to claim 3, wherein each active power semiconductor group has an associated maximum gate-to-emitter or gate-source voltage that is determined based on the pulse receiver module associated with the active power semiconductor group, wherein a total maximum voltage is a sum of all of the maximum gate-to-emitter or gate-source voltages, wherein the transformer unit has a turns ratio, and wherein the voltage pulse used to generate the current pulse is greater than the total maximum voltage as reflected through the turns ratio of the transformer unit.

5. The drive circuit according to claim 3, wherein the turns ratio of the transformer unit is 1:k, wherein k is greater than or equal to 2.

6. The drive circuit according to claim 5, wherein k is 2 through 10.

7. The drive circuit according to claim 3, wherein the plurality of reflected current pulses are synchronized with one another and substantially identical to one another.

8. The drive circuit according to claim 1, wherein each of the one or more gate oxide-isolated active power semiconductor devices is selected from a group consisting of IGBTs and MOSFETs.

9. The drive circuit according to claim 1, wherein the current pulse generated by the current pulse generation module has a type selected from a group of current pulse types based on one or more logic level signals output by the control module.

10. The drive circuit according to claim 9, wherein the one or more logic level signals output by the control module comprises a plurality of logic level signals, and wherein the current pulse types comprise a turn on pulse type, a refresh on pulse type, a turn off pulse type and a refresh off pulse type.

11. The drive circuit according to claim 10, wherein the plurality of logic level signals comprise a first logic signal that may have a high, low or neutral state and a second logic signal that may have only a high or a low state.

12. The drive circuit according to claim 6, wherein the control module comprises a plurality of control units, each of the control units generating one or more initial logic level signals, wherein the control module is structured to determine whether the one or more initial logic level signals of each control unit agree and output the one or more logic level signals only if the one or more initial logic level signals of each control unit agree.

13. A method of driving a number of series connected active power semiconductor groups, each of the active power semiconductor groups comprising one or more gate oxide-isolated active power semiconductor devices, the method comprising:
    generating a current pulse;
    providing the current pulse to a primary portion of a transformer unit and in response thereto causing a number of reflected current pulses to be reflected at a secondary portion of the transformer unit; and
    transferring and latching each of the reflected current pulses to create a respective latched gate drive signal; and
    providing each respective latched gate drive signal to an associated one of the active power semiconductor groups for driving the one or more gate oxide-isolated active power semiconductor devices of the associated one of the active power semiconductor groups.

14. The method according to claim 13, wherein the number of series connected active power semiconductor groups is a plurality of series connected active power semiconductor groups, and wherein the number of reflected current pulses is a plurality of reflected current pulses.

15. The method according to claim 14, wherein each active power semiconductor group has an associated maximum gate-to-emitter or gate-source voltage that is determined based on a pulse receiver module used in the converting step associated with the active power semiconductor group, wherein a total maximum voltage is a sum of all of the maximum gate-to-emitter or gate-source voltages, wherein the transformer unit has a turns ratio, and wherein a voltage pulse used to generate the current pulse is greater than the total maximum voltage as reflected through the turns ratio of the transformer unit.

16. The method according to claim 15, wherein the turns ratio of the transformer unit is 1:k, wherein k is greater than or equal to 2.

17. The method according to claim 16, wherein k is 2 through 10.

18. The method according to claim 14, wherein the plurality of reflected current pulses are synchronized with one another and substantially identical to one another.

19. The method according to claim 13, wherein each of the one or more gate oxide-isolated active power semiconductor devices is selected from a group consisting of IGBTs and MOSFETs.

20. The method according to claim 13, wherein the current pulse has a type selected from a group of current pulse types, the method further comprising generating one or more logic level signals and determining the type of the current pulse based on the one or more logic level signals.

21. The method according to claim 20, wherein the one or more logic level signals comprises a plurality of logic level signals, and wherein the current pulse types comprise a turn on pulse type, a refresh on pulse type, a turn off pulse type and a refresh off pulse type.

22. The method according to claim 21, wherein the plurality of logic level signals comprise a first logic signal that may have a high, low or neutral state and a second logic signal that may have only a high or a low state.

23. The method according to claim 20, wherein the generating one or more logic level signals comprises generating a plurality of sets of one or more initial logic level signals, determining whether the plurality of sets of one or more initial logic level signals agree, and outputting the one or more logic level signals only if the plurality of sets of one or more initial logic level signals agree.

* * * * *